US005661076A

United States Patent [19]
Yoo et al.

[11] Patent Number: 5,661,076
[45] Date of Patent: Aug. 26, 1997

[54] METHOD FOR FABRICATING A VERTICAL-CAVITY SURFACE-EMITTING LASER DIODE

[75] Inventors: Byeung-Su Yoo; Hyo-Hoon Park; Hye-Yong Chu; Min-Soo Park, all of Daejeon, Rep. of Korea

[73] Assignee: Electronics and Telecommunications Research Institute, Daejeon, Rep. of Korea

[21] Appl. No.: 623,817

[22] Filed: Mar. 29, 1996

[51] Int. Cl.$^6$ .................................................. H01L 21/20
[52] U.S. Cl. .................................................. 438/39; 438/41
[58] Field of Search ................................. 437/129, 133, 437/107

[56] References Cited

U.S. PATENT DOCUMENTS

| | | | |
|---|---|---|---|
| 5,468,656 | 11/1995 | Shieh et al. | 437/129 |
| 5,482,891 | 1/1996 | Shieh et al. | 437/129 |
| 5,498,568 | 3/1996 | Hosoba et al. | 437/129 |
| 5,585,306 | 12/1996 | Miyazawa | 437/129 |

Primary Examiner—Charles L. Bowers, Jr.
Assistant Examiner—Ramamohan Rao Paladugu
Attorney, Agent, or Firm—Antonelli, Terry, Stout & Kraus, LLP.

[57] ABSTRACT

A method for non-active processing of an etched surface in a vertical-cavity surface-emitting laser diode is provided. In order to obtain a stable single fundamental transverse mode, at a low temperature of 100 to 300 degrees, an amorphous GaAs is deposited on a surface of an etched active layer and an etched cavity. Also, a bottom emitting laser is provided which is formed by, with the metal electrode as a mask, etching the top mirror layer and the active layer, depositing the amorphous GaAs onto the etched portion and planarizing the deposited GaAs layer and depositing p-type metal pad over the amorphous GaAs around the formed laser device. Also, a top emission type laser is provided which is formed by, with a photoresist as a mask, etching the top mirror layer and the active layer, planarizing the GaAs layer and depositing p-type metal pad containing a window for light emission which is made smaller than laser area over the amorphous GaAs around the formed laser device. Thus, a more stable single fundamental transverse mode than in the conventional device can be obtained.

8 Claims, 3 Drawing Sheets

5,661,076

METHOD FOR FABRICATING A VERTICAL-CAVITY SURFACE-EMITTING LASER DIODE

BACKGROUND OF THE INVENTION

1. Field of the Invention

The present invention relates to a method for fabricating a vertical-cavity surface-emitting laser diode, more particularly to a method for making the laser device with an amorphous GaAs layer, which is around active layers, and an etched cavity for a single fundamental transverse mode emission, deposited in a low temperature.

2. Description of the Prior Art

The vertical-cavity surface-emitting laser diode is a promising device that can be used as an integrated laser light source in an optical communication system and an optical computer, which can process signals in parallel. The competitive researches for creating an applicable structure are now carried out. A single fundamental transverse mode emission is necessarily required to use such vertical-cavity surface-emitting laser diodes in the optical communication fields.

When an index-guided surface-emitting laser diode having an ion-etched cavity, one of the conventional vertical-cavity surface-emitting laser diodes, is fabricated, it is difficult to obtain a desired stable single fundamental transverse mode laser having a diameter of 7 micro-meter or more due to the strong confinement of the optical field with regards to the structure of etched mirror layer and active layer.

On the other hand, it is generally required to etch a cavity layer using a dry etching process in order to fabricate a vertical-cavity surface-emitting laser having a structure of an index-guided type laser. Herein, the exposed surface of the cavity by the etch process has numerous defects acting as a possible cause of leakage and surface recombination currents. Such leakage and surface recombination currents cause the threshold current of the laser operation to be raised.

In order to eliminate such leakage and surface recombination currents at the etched surface, there have been used the methods of depositing a $SiN_x$ layer therein and re-growing or sulfurizing the crystalline compound semiconductor of GaAs.

For example, the conventional structure for controlling the transverse mode requires a method for stabilizing a single transverse mode through an anti-guiding effect obtained by growing the crystalline AlGaAs/GaAs multi-layers, through a chemical deposition, having a higher refractive index than that of a InGaAs/GaAs active layer or a AlAs/GaAs mirror layer and high resistivity resulting from n-i-p-i doping. It has been shown in the paper, "Low threshold buried heterostructure vertical cavity surface emitting laser"—Appl. Phys. Lett. 63(10), 6 Sep. 1993 0003–6951/93/63(10)/1307/3/$6.00 1993 American Institute of Physics". Namely, the method shows that the crystalline n-i-p-i AlGaAs/GaAs multi-layers have a higher refractive index and a high resistivity are grown around the etched AlAs/GaAs mirror layer and InGaAs/GaAs active layer through the chemical deposition at a high temperature of 600 degrees for the purpose of stabilizing the transverse mode and non-activation of the etched surface.

In the conventional vertical-cavity surface-emitting laser as disclosed in the reference, the device has an advantage of a stabilizing a single transverse mode by the multi-layered structure composed of n-i-p-i AlGaAs/GaAs having a high refractive index.

However, since it has a multi-layered structure, there are problems such as the process steps are increased and the thickness of each layer should be controllably adjusted. In addition, the growth of the crystallized multi-layered structure at the high temperature of 600 degrees makes any associated processes complicated and may cause the thermal damage of device.

SUMMARY OF THE INVENTION

Therefore, it is an object of the present invention to provide a method for fabricating a vertical cavity surface emitting laser device having the feature of stabilizing the transverse mode.

Another object of the present invention is to provide a method of fabricating a laser device providing a stable single transverse mode and having a diameter of at least 15 micro-meters.

Another object of the present invention is to provide a fabricating method having reduced processing steps by depositing a single GaAs layer, instead of a multi-layered structure, with the processes simplified by the single layer formation.

Another object of the present invention is to provide a method comprising a low temperature fabrication process for preventing the device from thermal damage thereto.

The above objects can be accomplished by depositing an amorphous GaAs layer of high refractive index through a low temperature fabrication process over the surfaces of an etched mirror layer and an active layer.

An amorphous GaAs material has the semi-insulating properties and bonding character similar to the crystalline GaAs. Thus, the material is used as a non-active film over the surface of a compound semiconductor-based solid state element (e.g., field effect transistor or the like), a light detection element, or a lateral emission laser device.

Also, an amorphous GaAs has a higher refractive index than that of AlAs or the crystalline GaAs and also has a narrower band-gap. Thus, a post in the laser device having a mirror layer being composed of either AlAs/GaAs or AlGaAs/GaAs and an active layer being composed of either AlGaAs/GaAs or InGaAs/GaAs is covered with an amorphous GaAs, whereby an anti-guiding region can be obtained. This anti-guiding region suppresses the high order transverse mode emission to stabilize a transverse mode.

According to the present invention, the surface-emitting laser forming the anti-guiding layer obtained by depositing the amorphous GaAs can be classified into two types, a top emitting type and a bottom emitting type.

In a vertical-cavity surface-emitting laser diode, a fabricating method of a bottom emitting type laser diode having a deposited amorphous GaAs layer comprises the steps of: (a) successively growing a bottom mirror layer, an active layer and a top mirror layer over a semiconductor substrate; (b) forming an n-type electrode on a region immediately below said semiconductor substrate; (c) forming a metal mask by evaporation for forming a metal electrode on said top mirror layer, and etching a part of the bottom mirror layer and the top mirror and active layers; (d) depositing an amorphous GaAs layer over the whole surface of the etched structure, wherein the GaAs is deposited using MBE at a low temperature of 100 to 300 degrees; (e) etching the amorphous GaAs to expose said metal electrode having been deposited through the step (d); and (f) depositing a p-type electrode pad on the laser device formed by the above steps.

According to another aspect of the present invention, in a vertical-cavity surface-emitting laser diode, a method of fabricating a top emitting laser diode having a deposited amorphous GaAs layer comprises the steps of: (a) successively growing a bottom mirror layer, an active layer and a top mirror layer over a GaAs semiconductor substrate; (b) forming an n-type electrode on a region immediately below said GaAs semiconductor substrate; (c) depositing a protection layer on the top mirror layer; (d) defining a photoresist pattern on the protection layer, then etching the protection layer around the pattern by using the reactive ion etching process with fluoride gas, and etching a part of the bottom mirror layer, and the top mirror and active layers with chlorine gas; (e) depositing an amorphous GaAs over the whole surface of the etched structure, wherein the GaAs layer is deposited using MBE at the low temperature of 100 to 300 degrees; (f) etching the amorphous GaAs to expose said protection layer and removing the protection layer; and (g) depositing a p-type electrode pad having a window for light emission on the laser device formed by the above steps.

DETAILED DESCRIPTION OF PREFERRED EMBODIMENTS

The present invention provides a method of making a surface emitting laser by performing processes for making an etched surface non-active by depositing an amorphous GaAs, which will be explained hereinbelow with reference to drawings.

FIGS. 1A–1E are sectional views showing the fabricating process for a bottom emitting type laser diode.

Figure 1A:
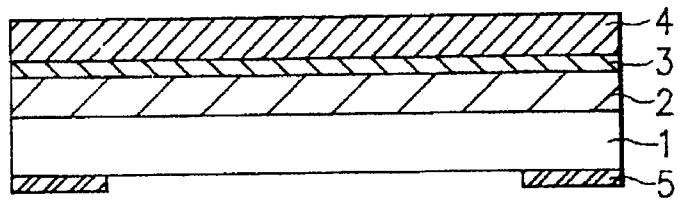
FIG. 1A through FIG. 1E are sectional views showing the respective steps of making a bottom emitting surface emitting laser diode in accordance with the preferred embodiment of the invention.

In fabricating the laser device, a substrate for a vertical-cavity surface-emitting laser device typically comprises a bottom mirror layer 2, an active layer 3 and a top mirror layer 4 and these layers are successively formed over a GaAs semiconductor substrate 1 as shown in FIG. 1A. The mirror layers 2 and 4 may have a layer of AlAs/GaAs or AlGaAs/GaAs, and the active layer 3 may have a layer of AlGaAs/GaAs or InGaAs/GaAs.

The substrate 1 described above also has an n-type electrode 5 formed on a region immediately below the GaAs semiconductor substrate 1.

Figure 1B:
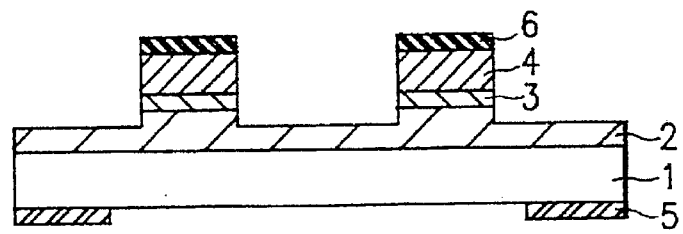

FIG. 1B is a sectional view explaining an etching process obtaining an index-guided structure. After performing an evaporation process for covering a predetermined pattern of a metal mask 6 in FIG. 1B, a reactive ion etching or reactive ion beam etching is conducted using the mask pattern 6 such that the top mirror layer 4, the active layer 3 and a bottom mirror layer 2 are partially etched.

The metal mask pattern 6 described above comprises multi-layered structure consisting of an Au layer and a Ni layer. And, a thickness of the Au layer formed by evaporation may be approximately 1000 to 5000 angstrom and a thickness of Ni layer may be approximately 500 to 2000 angstrom.

Figure 1C:
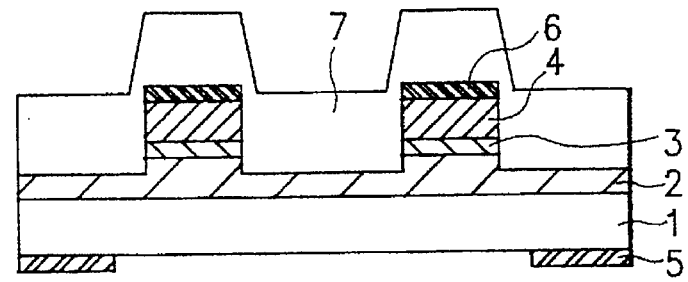

FIG. 1C shows the step for depositing an amorphous GaAs to form a layer of an amorphous GaAs 7.

Over the entire surface of the structure etched as shown in FIG. 1C is deposited an amorphous GaAs layer 7, wherein the amorphous GaAs is deposited through Molecular Beam Epitaxy (MBE) method at the low temperature of 100 to 300 degrees.

A thickness of the deposited amorphous GaAs layer 7 is such that the active layer 3 can be completely covered with the layer 7, and preferably is from 1 micro-meter to 3 micro-meters for planarization of the etched steps.

Figure 1D:
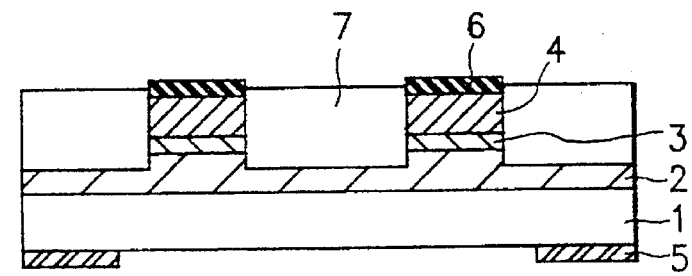

FIG. 1D shows an exposed metal layer 6 by removing an amorphous GaAs on the laser device.

The method for removing an amorphous GaAs on the metal layer 6 may comprise the steps of forming a photoresist pattern and then applying a reactive ion beam etching using chlorine or the reactive ion etching method.

Figure 1E:
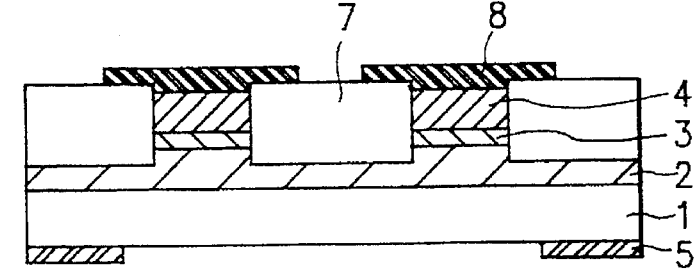

Referring to FIG. 1E, the process for fabricating a desired device is completed by depositing a layer of a p-type electrode 8 as the top electrode on the metal pattern 6.

FIG. 2 shows the steps of fabricating a top emitting laser diode, in which like reference characters designate the same parts in FIG. 1.

Figure 2A:
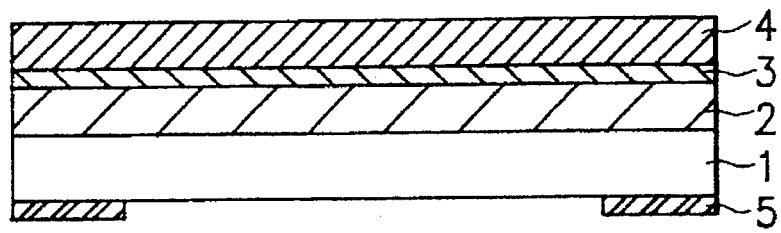
FIG. 2A through FIG. 2F are sectional views showing the respective steps of making a top emitting surface emitting laser diode in accordance with another embodiment of the invention.

In fabricating a laser device, a substrate for a vertical cavity surface emitting laser device typically comprises a bottom mirror layer 2, an active layer 3 and a top mirror layer 4 as shown in FIG. 2A and these layers are successively formed over a GaAs semiconductor substrate 1. The mirror layers 2 and 4 may have a layer of AlAs/GaAs or AlGaAs/GaAs, and the active layer 3 may have a layer of AlGaAs/GaAs or InGaAs/GaAs.

The substrate described above also has an n-type electrode 5 formed on a region immediately below the GaAs semiconductor substrate 1.

Figure 2B:
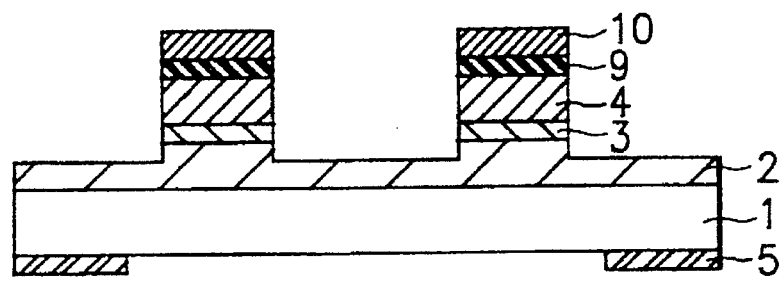

FIG. 2B is a sectional view explaining an etching process for obtaining an index-guided structure. On the top mirror layer 4 in FIG. 2A is deposited a protection layer 9 of SiNx or SiO₂ having a thickness of 500 to 2000 angstrom. Then, a predetermined pattern of a photoresist film 10 on the protection layer 9 is defined.

Figure 2C:
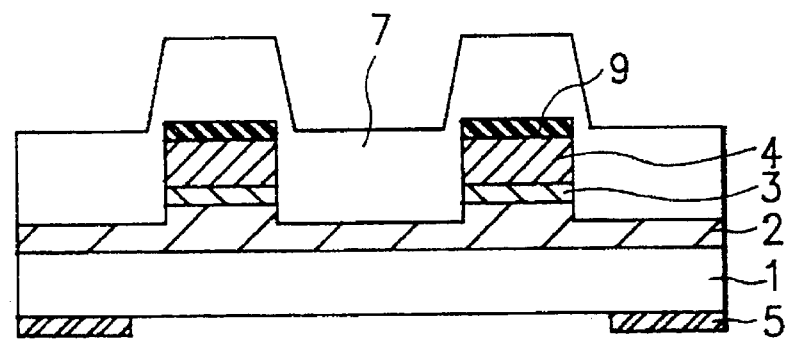

At first, the protection layer 9 existing around the photoresist-film pattern 10 is removed using the reactive ion etching with fluoride gas. Then, a partial bottom mirror layer 2 and the top mirror layer 4 and the active layer 3 are etched using the reactive ion etching with Cl gas or a reactive ion beam etching process. FIG. 2C shows the step of depositing an amorphous GaAs layer 7.

With the remaining photoresist pattern 10 in the etched structure in FIG. 2B removed, over the entire surface of the resultant structure is deposited an amorphous GaAs layer 7. The amorphous GaAs is deposited through MBE method, at the low temperature of 100 to 300 degrees.

A thickness of the deposited amorphous GaAs layer 7 is such that the active layer 3 can be completely covered with the layer 7, and preferably is from 1 micro-meter to 3 micro-meters for planarization of the etched steps.

Figure 2D:
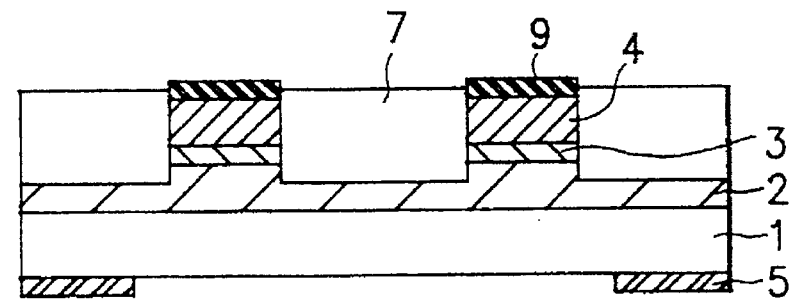

FIG. 2D shows the exposed protection layer 6 by removing an amorphous GaAs layer on the laser device.

An amorphous GaAs on the protection layer 6 is removed, in which the method may comprise the steps of defining the photoresist pattern and then preforming the reactive ion etching process with Cl gas or a reactive ion beam etching.

Figure 2E:
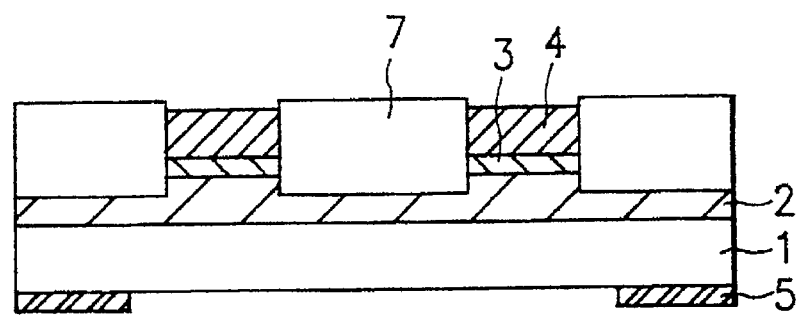

FIG. 2E is a sectional view showing the resulting structure after the protection layer 9 on the laser device is removed.

The protection layer 9 may be removed using the reactive ion etching with fluoride gas.

Figure 2F:
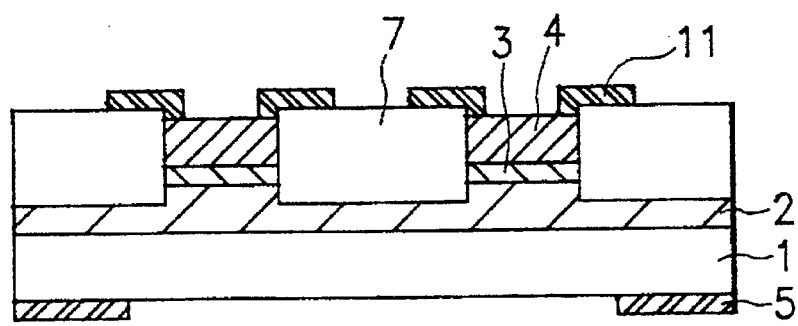

As shown in FIG. 2F, a complete device is obtained having a p-type electrode pad 11 containing a window for light emission therein, wherein the pad 11 can be formed by evaporation. The size of window in the p-type electrode pad is made smaller than that of a portion in the laser device such that the electrode pad 9 comes in partial contact with the top mirror layer 4, resulting in the injection of the current.

In the laser device in accordance with the present invention as fabricated by the above-described processes, the electrical power applied to the top and bottom electrodes 8, 11 and 5 causes the injection of the holes at the side of the top electrode 8, 11 and the injection of the electrons at the side of the bottom electrode 5 to active region. The carrier density beyond the threshold value causes the device to create laser operation, thereby the laser light is emitted.

As seen from the above, the laser diode device manufactured in accordance with the present invention exhibits the following advantages.

First, the anti-guiding effect permits the fundamental transverse mode to be stable, therefore a single transverse mode is attained. Thus, the diameter of the laser device for stable transverse mode operation can be increased to 15 micro-meters or more.

Second, an amorphous GaAs having high resistivity and tetrahedral bonding character similar to crystalline GaAs allows the effective isolation between devices and the surface of the etched cavity and active layer to be electrically non-active.

Third, the planarization of the etched steps by the etch process can be accomplished.

Finally, since the method comprises the low temperature process for an amorphous GaAs, the processes becomes simple. Further, the bottom emitting laser device provides the advantages of protecting the interface between the mirror surface and the top electrode in the device from the thermal damages.

Many different embodiments of the present invention may be constructed without departing from the spirit and scope of the invention. It should be understood that the present invention is not limited to the specific embodiments described in this specification. To the contrary, the present invention is intended to cover various modifications and equivalent arrangements included within the spirit and scope of the claims.

What is claimed is:

1. A method for fabricating a vertical-cavity surface-emitting laser diode, the method comprising the steps of:

growing AlGaAs/GaAs or InGaAs/GaAs as an active layer on a semiconductor substrate; and depositing an amorphous GaAs film formed between 100–300 degrees centigrade for covering an etched cavity exposed by an etching processing for etching a mirror layer and the active layer to thereby achieve an emission of a stable fundamental transverse mode.

2. A method for fabricating a vertical-cavity surface-emitting laser diode, said method comprising the steps of:

(a) successively growing a bottom mirror layer, an active layer and a top mirror layer over a semiconductor substrate;

(b) forming an n-type electrode on a region immediately below said semiconductor substrate;

(c) forming a metal mask by an evaporation processing for forming a metal electrode on said top mirror layer to then etch a partial bottom mirror layer, and the top mirror and active layers;

(d) depositing an amorphous GaAs over the whole surface of the etched structure;

(e) etching the amorphous GaAs to expose said metal electrode having been deposited through said step (d); and (f) depositing a p-type electrode pad on the laser device formed by said steps (a)–(e).

3. A method as claimed in claim 2, wherein each of the bottom and top mirror layers comprises a AlAs/GaAs or AlAs/GaAs layer, and the active layer comprises a layer of AlGaAs/GaAs or InGaAs/GaAs.

4. A method as claimed in claim 2, wherein the metal mask pattern comprises a multi-layered structure including an Au layer and a Ni layer, wherein further a thickness of the Au layer is approximately 1000 to 5000 angstrom and a thickness of the Ni layer is approximately 500 to 2000 angstrom.

5. A method as claimed in claim 2, wherein the amorphous GaAs in said step (d) is deposited using MBE at a low temperature of 100 to 300 degrees, the deposited thickness thereof being from to 1 to 3 micro-meters for planarization of the etched steps.

6. A method of claimed in claim 2, wherein the etching processing for removing the amorphous GaAs in said step (e) comprises the steps of:

defining a photoresist pattern; and performing the reactive ion etching processing with Cl or a reactive ion beam etching.

7. A method for fabricating a vertical-cavity surface-emitting laser diode, said method comprising the steps of:

(a) successively growing a bottom mirror layer, an active layer and a top mirror layer over a GaAs semiconductor substrate;

(b) forming an n-type electrode on a region immediately below said GaAs semiconductor substrate;

(c) depositing a protection layer on the top mirror layer;

(d) defining a photoresist pattern on the protection layer, etching the protection layer around the pattern by using the reactive ion etching process with fluoride gas, and etching a part of the bottom mirror layer, and the top mirror and active layers with chlorine gas;

(e) depositing an amorphous GaAs over the whole surface of the etched structure, wherein the GaAs layer is deposited using MBE at a low temperature of 100 to 300 degrees;

(f) etching the amorphous GaAs to expose said protection layer and removing the protection layer; and (g) depositing a p-type electrode pad having window for light emission on the laser device formed by said steps (a)–(f).

8. A method as claimed in claim 7 in which the size of window in the p-type electrode pad in said step (g) is made smaller than that of a portion in the laser device such that the electode pad comes to partial contact with the top mirror layer.

* * * * *